(12) United States Patent
Hoogendam et al.

(10) Patent No.: US 9,360,765 B2
(45) Date of Patent: *Jun. 7, 2016

(54) LITHOGRAPHIC APPARATUS AND DEVICE MANUFACTURING METHOD

(71) Applicant: ASML NETHERLANDS B.V., Veldhoven (NL)

(72) Inventors: Christiaan Alexander Hoogendam, Veldhoven (NL); Antonius Theodorus Anna Maria Derksen, Eindhoven (NL); Sjoerd Nicolaas Lambertus Donders, 's-Hertogenbosch (NL); Joeri Lof, Eindhoven (NL); Erik Roelof Loopstra, Heeze (NL); Johannes Catharinus Hubertus Mulkens, Waalre (NL); Hans Jansen, Eindhoven (NL); Jacobus Johannus Leonardus Hendricus Verspay, Thorn (NL); Alexander Straaijer, Eindhoven (NL); Bob Streefkerk, Tilburg (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/816,997

(22) Filed: Aug. 3, 2015

(65) Prior Publication Data
US 2015/0338748 A1  Nov. 26, 2015

Related U.S. Application Data

(60) Continuation of application No. 13/866,879, filed on Apr. 19, 2013, now Pat. No. 9,097,987, which is a division of application No. 12/796,482, filed on Jun. 8, 2010, now Pat. No. 8,446,568, which is a continuation (Continued)

(30) Foreign Application Priority Data

Nov. 12, 2002 (EP) .................................... 02257822
Jun. 9, 2003 (EP) .................................... 03253636
Jun. 26, 2003 (EP) .................................... 03254059

(51) Int. Cl.
*G03B 27/58* (2006.01)
*G03F 7/20* (2006.01)
*G03F 9/00* (2006.01)

(52) U.S. Cl.
CPC ............ *G03F 7/70341* (2013.01); *G03F 7/707* (2013.01); *G03F 7/7085* (2013.01); *G03F 7/70833* (2013.01); *G03F 7/70916* (2013.01); *G03F 9/7088* (2013.01)

(58) Field of Classification Search
CPC . G03F 7/70341; G03F 7/707; G03F 7/70833; G03F 7/7085; G03F 7/70916; G03F 9/7088
USPC .......................................................... 355/30
See application file for complete search history.

(56) References Cited

U.S. PATENT DOCUMENTS 3,573,975 A 4/1971 Dhaka et al.
3,648,587 A 3/1972 Stevens (Continued)

FOREIGN PATENT DOCUMENTS

CN 1341277 3/2002
DE 206 607 2/1984

(Continued)

OTHER PUBLICATIONS

EP Search Report for EP 02257938 dated Sep. 25, 2003.

(Continued)

*Primary Examiner* — Peter B Kim
(74) *Attorney, Agent, or Firm* — Pillsbury Winthrop Shaw Pittman LLP

(57) ABSTRACT

A lithographic projection apparatus includes a support structure configured to hold a patterning device, the patterning device configured to pattern a beam of radiation according to a desired pattern; a substrate table configured to hold a substrate; a projection system configured to project the patterned beam onto a target portion of the substrate; a liquid supply system configured to provide liquid to a space between the projection system and the substrate; and a shutter configured to isolate the space from the substrate or a space to be occupied by a substrate.

20 Claims, 9 Drawing Sheets

Related U.S. Application Data of application No. 11/499,780, filed on Aug. 7, 2006, now Pat. No. 7,932,999, which is a division of application No. 10/831,370, filed on Apr. 26, 2004, now Pat. No. 7,110,081, which is a continuation-in-part of application No. 10/705,785, filed on Nov. 12, 2003, now Pat. No. 7,075,616.

(56) References Cited

U.S. PATENT DOCUMENTS

| | | |
|---|---|---|
| 4,280,054 A | 7/1981 | Guarino |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 4,999,669 A | 3/1991 | Sakamoto et al. |
| 5,040,020 A | 8/1991 | Rauschenbach et al. |
| 5,121,256 A | 6/1992 | Corle et al. |
| 5,229,872 A | 7/1993 | Mumola |
| 5,296,891 A | 3/1994 | Vogt et al. |
| 5,517,344 A | 5/1996 | Hu et al. |
| 5,523,193 A | 6/1996 | Nelson |
| 5,610,683 A | 3/1997 | Takahashi |
| 5,633,698 A | 5/1997 | Imai |
| 5,715,039 A | 2/1998 | Fukuda et al. |
| 5,825,043 A | 10/1998 | Suwa |
| 5,883,704 A | 3/1999 | Nishi et al. |
| 5,900,354 A | 5/1999 | Batchelder |
| 5,969,441 A | 10/1999 | Loopstra et al. |
| 5,997,963 A | 12/1999 | Davison et al. |
| 6,046,792 A | 4/2000 | Van Der Werf et al. |
| 6,191,429 B1 | 2/2001 | Suwa |
| 6,236,634 B1 | 5/2001 | Lee et al. |
| 6,417,914 B1 | 7/2002 | Li |
| 6,421,112 B1 | 7/2002 | Bisschops et al. |
| 6,426,790 B1 | 7/2002 | Hayashi |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,710,849 B2 | 3/2004 | Kwan et al. |
| 6,788,477 B2 | 9/2004 | Lin |
| 6,801,301 B2 | 10/2004 | Miyajima et al. |
| 6,842,256 B2 | 1/2005 | Hill |
| 6,867,844 B2 | 3/2005 | Vogel et al. |
| 6,952,253 B2 | 10/2005 | Lof et al. |
| 6,954,256 B2 | 10/2005 | Flagello et al. |
| 7,009,682 B2 | 3/2006 | Bleeker |
| 7,075,616 B2 | 7/2006 | Derksen et al. |
| 7,081,943 B2 | 7/2006 | Lof et al. |
| 7,110,081 B2 | 9/2006 | Hoogendam et al. |
| 7,193,232 B2 | 3/2007 | Lof et al. |
| 7,199,858 B2 | 4/2007 | Lof et al. |
| 7,224,436 B2 | 5/2007 | Derksen et al. |
| 7,388,648 B2 | 6/2008 | Lof et al. |
| 7,411,657 B2 | 8/2008 | Ottens et al. |
| 7,545,479 B2 | 6/2009 | Binnard |
| 7,593,093 B2 | 9/2009 | Lof et al. |
| 7,978,306 B2 | 7/2011 | Ottens et al. |
| 7,982,850 B2 | 7/2011 | Lof et al. |
| 8,564,763 B2 | 10/2013 | Jacobs et al. |
| 2001/0038442 A1 | 11/2001 | Hansell et al. |
| 2002/0018190 A1 | 2/2002 | Nogawa et al. |
| 2002/0020821 A1 | 2/2002 | Van Santen et al. |
| 2002/0145717 A1 | 10/2002 | Baselmans et al. |
| 2002/0163629 A1 | 11/2002 | Switkes et al. |
| 2003/0095244 A1 | 5/2003 | Komatsu |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0119954 A1 | 6/2004 | Kawashima et al. |
| 2004/0125351 A1 | 7/2004 | Krautschik |
| 2004/0135099 A1 | 7/2004 | Simon |
| 2004/0136494 A1 | 7/2004 | Lof et al. |
| 2004/0160582 A1 | 8/2004 | Lof et al. |
| 2004/0211920 A1 | 10/2004 | Derksen et al. |
| 2004/0263809 A1 | 12/2004 | Nakano |
| 2005/0110973 A1 | 5/2005 | Streefkerk et al. |
| 2005/0132914 A1 | 6/2005 | Mulkens et al. |
| 2005/0134815 A1 | 6/2005 | Van Santen et al. |
| 2005/0174549 A1 | 8/2005 | Duineveld et al. |
| 2005/0175940 A1 | 8/2005 | Dierichs |
| 2005/0264778 A1 | 12/2005 | Lof et al. |
| 2006/0023186 A1 | 2/2006 | Binnard |
| 2006/0132740 A1 | 6/2006 | Ebihara |
| 2006/0268250 A1 | 11/2006 | Hoogendam et al. |
| 2009/0279061 A1 | 11/2009 | Jacobs et al. |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 477 856 A1 | 11/2004 |
| EP | 1 571 696 A1 | 9/2005 |
| EP | 1 571 697 | 9/2005 |
| EP | 1 628 329 A1 | 2/2006 |
| FR | 2474708 | 7/1981 |
| JP | 58-202448 | 11/1983 |
| JP | S59-019912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 6-084757 | 3/1994 |
| JP | 06-124873 | 5/1994 |
| JP | 6-168866 | 6/1994 |
| JP | 07-132262 | 5/1995 |
| JP | 07-220990 | 8/1995 |
| JP | 10-154659 | 6/1998 |
| JP | 10-228661 | 8/1998 |
| JP | 10-255319 | 9/1998 |
| JP | 10-303114 | 11/1998 |
| JP | 10-340846 | 12/1998 |
| JP | 11-126112 | 5/1999 |
| JP | 11-176727 | 7/1999 |
| JP | H11-239758 | 9/1999 |
| JP | 2000-058436 | 2/2000 |
| JP | 2000-331931 | 11/2000 |
| JP | 2001-091849 | 4/2001 |
| JP | 2002-513856 | 5/2002 |
| JP | 2002-170754 | 6/2002 |
| JP | 2002-358556 | 12/2002 |
| JP | 2004-165666 | 6/2004 |
| JP | 2004-193252 | 7/2004 |
| JP | 2004-289126 | 10/2004 |
| JP | 2005-012201 | 1/2005 |
| JP | 2005-101488 | 4/2005 |
| JP | 2005-223275 | 8/2005 |
| JP | 2005-277363 | 10/2005 |
| JP | 2007-142460 | 6/2007 |
| JP | 2010-135857 | 6/2010 |
| WO | WO 98/33096 | 7/1998 |
| WO | WO 98/38597 | 9/1998 |
| WO | WO 98/40791 | 9/1998 |
| WO | WO 99/49504 | 9/1999 |
| WO | 02/063613 | 8/2002 |
| WO | WO 03/077036 | 9/2003 |
| WO | WO 03/077037 | 9/2003 |
| WO | WO 2004/019128 | 3/2004 |
| WO | 2004/053596 A2 | 6/2004 |
| WO | 2004/053950 A1 | 6/2004 |
| WO | 2004/053951 A1 | 6/2004 |
| WO | 2004/053952 A1 | 6/2004 |
| WO | 2004/053953 A1 | 6/2004 |
| WO | 2004/053954 A1 | 6/2004 |

(56) References Cited

FOREIGN PATENT DOCUMENTS

| WO | 2004/053955 A1 | 6/2004 |
|---|---|---|
| WO | 2004/053956 A1 | 6/2004 |
| WO | 2004/053957 A1 | 6/2004 |
| WO | 2004/053958 A1 | 6/2004 |
| WO | 2004/053959 A1 | 6/2004 |
| WO | 2004/055803 A1 | 7/2004 |
| WO | 2004/057589 A1 | 7/2004 |
| WO | 2004/057590 A1 | 7/2004 |
| WO | 2004/090577 | 10/2004 |
| WO | WO 2004/090577 | 10/2004 |

OTHER PUBLICATIONS

M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
Examination Report for Application No. 03 257 072.3 dated Mar. 28, 2008.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsyst.* 1(1):7-12 (2002).

Office Action in related application EP 03 257 071.5 mailed Dec. 7, 2009.
U.S. Appl. No. 60/462,499 titled "Landing Pad for Immersion Lithography", filed Apr. 11, 2003 in the U.S. Patent and Trademark Office.
Chinese Office Action dated Dec. 7, 2011 in corresponding Chinese Patent Application No. 200910002111.5.
European Office Action dated Apr. 12, 2012 in corresponding European Patent Application No. 03 257 070.7.
Japanese Office Action mailed Jul. 24, 2012 in corresponding Japanese Patent Application No. 2011-243516.
U.S. Office Action mailed May 24, 2012 in corresponding U.S. Appl. No. 12/512,754.
U.S. Office Action mailed Jun. 8, 2012 in corresponding U.S. Appl. No. 13/149,404.
U.S. Office Action mailed Jun. 14, 2012 in corresponding U.S. Appl. No. 12/698,938.
U.S. Office Action mailed Sep. 25, 2012 in corresponding U.S. Appl. No. 12/850,472.
U.S. Office Action mailed Sep. 27, 2012 in corresponding U.S. Appl. No. 12/698,932.
U.S. Office Action mailed Oct. 15, 2012 in corresponding U.S. Appl. No. 13/149,404.
U.S. Office Action mailed Oct. 24, 2012 in corresponding U.S. Appl. No. 12/512,754.
U.S. Office Action mailed Nov. 26, 2012 in corresponding U.S. Appl. No. 12/698,938.
U.S. Office Action mailed Mar. 4, 2013 in corresponding U.S. Appl. No. 12/850,472.
Japanese Office Action mailed May 31, 2013 in corresponding Japanese Patent Application No. 2011-281445.
Japanese Office Action mailed Jun. 12, 2013 in corresponding Japanese Patent Application No. 2012-027270.
U.S. Office Action dated Jun. 20, 2013 in corresponding U.S. Appl. No. 12/512,754.
Chinese Notification of Completion of Formalities for Registration dated Jul. 1, 2013 in corresponding Chinese Patent Application No. 201110083335.0.
Singapore Search Report and Written Opinion dated Nov. 4, 2013 in corresponding Singapore Patent Application No. 201005011-0.
U.S. Office Action mailed Oct. 25, 2013 in corresponding U.S. Appl. No. 13/722,830.
U.S. Office Action mailed Sep. 9, 2013 in corresponding U.S. Appl. No. 13/149,404.
U.S. Office Action mailed Nov. 20, 2013 in corresponding U.S. Appl. No. 12/512,754.
U.S. Office Action mailed Nov. 12, 2013 in corresponding U.S. Appl. No. 13/195,248.
U.S. Office Action mailed Nov. 14, 2013 in corresponding U.S. Appl. No. 13/306,532.
Japanese Office Action mailed Nov. 8, 2013 in corresponding Japanese Patent Application No. 2012-066781.
U.S. Office Action mailed Apr. 3, 2014 in corresponding U.S. Appl. No. 13/194,136.
U.S. Office Action mailed Apr. 3, 2014 in corresponding U.S. Appl. No. 12/512,754.
U.S. Office Action mailed Apr. 4, 2014 in corresponding U.S. Appl. No. 13/195,248.
U.S. Office Action mailed Apr. 4, 2014 in corresponding U.S. Appl. No. 13/306,532.
U.S. Office Action mailed Feb. 24, 2014 in corresponding U.S. Appl. No. 13/722,830.
U.S. Notice of Allowance mailed Mar. 17, 2014 in corresponding U.S. Appl. No. 13/149,404.
U.S. Office Action dated Aug. 21, 2014 in corresponding U.S. Appl. No. 13/194,136.
Jan Mullkens et al., "ASML Optical Lithography Solutions for 65 nm and 45 nm Node," Semicon Japan, pp. 1-29, (Dec. 5, 2003).
"ASML 193nm Immersion Lithography," International Sematech Litho Forum, pp. 1-22 (Jan. 28, 2004).
V. LeRoux et al., "A reflection lithography using multicharged ions," Microelectronic Engineering, vol. 57-58, pp. 239-245 (2001).

(56) References Cited

OTHER PUBLICATIONS

Ivor Brodie et al., "A Multiple-Electron-Beam Exposure System for High-Throughput, Direct-Write Submicrometer Lithography," IEEE Transactions on Electron Devices, vol. EDS-28, No. 11, pp. 1422-1428 (Nov. 1981).

Yuen-Chuen Chan et al., "Development and applications of a laser writing lithography system for maskless patterning," Opt. Eng., vol. 37, No. 9, pp. 2521-2530 (Sep. 1998).

W. Häßler-Grohne et al., "An electron optical metrology system for pattern placement measurements," Meas. Sci. Technol., vol. 9, pp. 1120-1128 (1998).

Shoji Maruo et al., "Submicron stereolithography for the production of freely movable mechanisms by using single-photon polymerization," Sensors and Actuators A, vol. 100, pp. 70-76 (2002).

F. Abboud et al., "Evaluation of the MEBES® 4500 reticle writer to commercial requirements of 250 nm design rule IC devices," Proc of SPIE, vol. 2793, pp, 438-451 (Jul. 24, 1996).

Toru Tojo et al., "Advanced electron beam writing system EX-11 for next-generation mask fabrication," Proc. of SPIE, vol. 3748, pp. 416-425 (Sep. 1999).

Yoshiyuki Tomita et al., "A surface motor-driven precise positioning system," Precision Engineering, vol. 16, No. 3, pp. 184-191 (Jul. 1994).

Chang-Woo Lee et al., "An ultraprecision stage for alignment of wafers in advanced microlithography," Precision Engineering, vol. 21, No. 2/3, pp. 113-122, (Sep./Dec. 1997).

H. Löschner et al., "Ion projection lithography for vacuum microelectronics," J. Vac. Sci. Technol. B, vol. 11, No. 2, pp. 487-492 (Mar./Apr. 1993).

Hans Loeschner et al., "Large-Field Ion-Optics for Projection and Proximity Printing and for Mask-Less Lithography (ML2)," Proc. of SPIE, vol. 4688, pp. 595-606 (2002).

Won-jong Kim et al., "Modeling and Vector Control of Planar Magnetic Levitator," IEEE Transactions on Industry Applications, vol. 34, No. 6, pp. 1254-1262 (Nov./Dec. 1998).

Rodney Kendall et al., "A servo guided $X$—$Y$—theta stage for electron beam lithography," J. Vac. Sci. Technol. B, vol. 9, No. 6, pp. 3019-3023 (Nov./Dec. 1991).

T. Kato et al., "Submicron pattern fabrication by focused ion beams," J. Vac. Sci. Technol. B, vol. 3, No. 1, pp. 50-53 (Jan./Feb. 1985).

Hans C. Pfeiffer, "PREVAIL: Proof-of-Concept System and Results," Microelectronic Engineering, vol. 53, pp. 61-66 (2000).

L.M. Buchmann et al., "Lithography with High Depth of Focus by an Ion Projection System," Journal of Microelectromechanical Systems, vol. 1, No. 3, pp. 116120 (Sep. 1992).

T.C. Bailey et al., "Step and Flash Imprint Lithography: An Efficient Nanoscale Printing Technology," Journal of Photopolymer Science and Technology, 6 pages (2002).

Oui-Serg Kim et al., "Positioning Performance and Straightness Error Compensation of the Magnetic Levitation Stage Supported by the Linear Magnetic Bearing," IEEE Transactions on Industrial Electronics, vol. 50, No. 2, pp. 374-378 (Apr. 2003).

Ampere A. Tseng et al., "Electron Beam Lithography in Nanoscale Fabrication: Recent Development," IEEE Transactions on Electronics Packaging Manufacturing, vol. 26, No. 2, pp. 141-149 (Apr. 2003).

Qing Ji, "Maskless, Resistless Ion Beam Lithography Processes," University of Berkeley, 128 pages (Spring 2003).

R.S. Dhaliwal et al., "PREVAIL—Electron projection technology approach for next-generation lithography," IBM J. Res. & Dev., vol. 45, No. 5, pp. 615-638 (Sep. 2001).

Kazuaki Suzuki, "EPL Technology Development," Proc. of SPIE, vol. 4754, pp. 775-789 (2002).

G. Stengl et al., "Current status of Ion Projection Lithography," Proc. of SPIE, vol. 537, pp. 138-145 (1985).

Ernst Thielicke et al., "Microactuators and their technologies," Mechatronics, vol. 10, pp. 431-455 (2000).

G. Stangl et al., "Submicron Lithography and DUV-Master Masks Made by Ion Projection Lithography," Microelectronic Engineering, vol. 3, pp. 167-171 (1985).

G. Stengl et al., "Ion projection lithography machine IPLM01: A new tool for sub-0.5-micron modification of materials," J. Vac. Sci. Technol. B, vol. 4, No. 1, pp. 194-200 (Jan./Feb. 1986).

Rik Kneppers, "HP Laser Interferometers," Vaisala News, vol. 151, pp. 34-37 (1999).

Carl G. Chen et al., "Nanometer-accurate Grating Fabrication with Scanning Beam Interference Lithography," Proc. of SPIE, vol. 4936, pp. 126-134 (2002).

G. de Zwart et al., "Performance of a Step and Scan System for DUV Lithography," SPIE Symposium on Optical Microlithography in Santa Clara, pp. 0-18 (Mar. 1997).

U.S. Office Action dated Dec. 31, 2014 in corresponding U.S. Appl. No. 13/692,865.

U.S. Office Action dated Oct. 7, 2015 in corresponding U.S. Appl. No. 14/701,236.

U.S. Office Action dated Sep. 30, 2015 in corresponding U.S. Appl. No. 13/615,190.

U.S. Office Action dated Aug. 5, 2015 in corresponding U.S. Appl. No. 13/306,532.

LITHOGRAPHIC APPARATUS AND DEVICE MANUFACTURING METHOD

This is application is a continuation of U.S. patent application Ser. No. 13/866,879, filed Apr. 19, 2013, which is a divisional of U.S. patent application Ser. No. 12/796,482, filed Jun. 8, 2010, now U.S. Pat. No. 8,446,568, which is a continuation application of U.S. patent application Ser. No. 11/499,780, filed Aug. 7, 2006, now U.S. Pat. No. 7,932,999, which is a divisional application of U.S. patent application Ser. No. 10/831,370, filed Apr. 26, 2004, now U.S. Pat. No. 7,110,081, which is a continuation-in-part patent application of U.S. patent application Ser. No. 10/705,785, filed Nov. 12, 2003, now U.S. Pat. No. 7,075,616, and claims priority from European patent applications EP 02257822.3, filed Nov. 12, 2002, EP 03253636.9, filed Jun. 9, 2003, and EP 03254059.3, filed Jun. 26, 2003, each of the foregoing applications herein incorporated in its entirety by reference.

FIELD

The present invention relates to immersion lithography.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in the lithographic projection apparatus in a liquid having a relatively high refractive index, e.g. water so as to fill a space between the final element of the projection system and the substrate. The point of this is to enable imaging of smaller features as the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see for example U.S. Pat. No. 4,509,852, hereby incorporated in its entirety by reference) may mean that there is a large body of liquid that must be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 9 and 10, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 9 shows the arrangement schematically in which liquid is supplied via inlet IN and is taken up on the other side of the element by outlet OUT which is connected to a low pressure source. In the illustration of FIG. 9 the liquid is supplied along the direction of movement of the substrate relative to the final element, though this does not need to be the case. Various orientations and numbers of in- and out-lets positioned around the final element are possible, one example is illustrated in FIG. 10 in which four sets of an inlet with an outlet on either side are provided in a regular pattern around the final element.

SUMMARY

With such and other arrangements for providing liquid on only a localized area of the substrate, the substrate itself acts to contain the liquid of the liquid supply system in a space between the final element of the projection system and the substrate. If the substrate is removed (for example, during substrate exchange) and no other measures are taken, the liquid will run out of the liquid supply system. Clearly this is a situation which is to be avoided. The liquid can be removed from the space before the substrate is moved. However, as the residue of liquid which is inevitably left behind when the liquid supply system is emptied of liquid, dries, drying spots may be left behind on elements of the projection system which were immersed in the liquid during exposure. This may be clearly detrimental to the continuing high performance of the projection system. Also, on refilling the space with liquid, it may be hard to avoid the formation of bubbles. Filling of the space with liquid will also take time and may reduce throughput time.

Accordingly, it may be advantageous to provide, for example, a lithographic projection apparatus in which immersion lithography can be performed and in which removing liquid from the liquid supply system during substrate exchange can be avoided or reduced.

According to an aspect, there is provided a lithographic projection apparatus comprising:

a support structure configured to hold a patterning device, the patterning device configured to pattern a beam of radiation according to a desired pattern;

a substrate table configured to hold a substrate;

a projection system configured to project the patterned beam onto a target portion of the substrate;

a liquid supply system configured to provide an immersion liquid, through which said beam is to be projected, in a space between said projection system and said substrate; and a shutter configured to keep said projection system in contact with liquid when said substrate is moved away from under said projection system.

In this way drying marks on the projection system can be avoided. This solution is ideal for a localized area liquid supply system which provides immersion liquid to only a localized area of the substrate. One arrangement could involve one or more jets to project liquid onto the projection system during substrate swap.

In an embodiment, there is provided a shutter positionable on a side of said liquid supply system opposite said projection system such that liquid can be confined in said liquid supply system and between said projection system and said shutter. With this arrangement, for example, the shutter can be moved under the liquid supply system after exposure of the substrate in order to contain the immersion liquid. The substrate may then be moved from the substrate table without substantially losing liquid from the liquid supply system, because the shutter takes the place of the substrate and is of a size equal to or greater than the localized area so that liquid can't substantially escape between the projection system and the shutter.

In an embodiment, the shutter comprises a surface of said substrate table. With this arrangement, the substrate table is moved after exposure to a position at which the substrate may be removed but also to a position at which the shutter is positioned over the liquid supply system. A seal, such as a gas seal, which can also be used to seal a liquid confinement structure that extends along at least a part of the boundary of said space to contain liquid and that forms an aperture for said patterned beam to pass through to the substrate during exposure, can remain activated to seal between the liquid supply system and the shutter. The shutter blocks the aperture. Alternatively, the shutter may be raised relative to the structure to abut the structure and the seal can then be de-activated.

In an embodiment, the shutter is separable from the remainder of the apparatus. It is also movable relative to the remainder of the apparatus. That is, the shutter is relatively small, perhaps shaped like a plate, and not permanently attached to other parts of the apparatus. In this embodiment, the substrate table can be moved completely away from the liquid supply system after exposure as the shutter is positioned over the liquid supply system and is independent of the substrate table. In this embodiment the shutter can be carried by the substrate table during exposure and to this end the shutter and/or the substrate table has or have a holding device configured to releasably hold the shutter to the substrate table. Also, an attachment device may be provided to releasably attach the shutter to the liquid supply system. The attachment device or the holding device may comprise a magnet to generate the force required to attach or hold. Alternatively, those devices may comprise a vacuum outlet configured to attract the shutter to the substrate table and/or the liquid supply system. In the case of the attachment device, use may be made of a gas seal configured to seal between the liquid supply system and the substrate during exposure in order to provide the force to attach the shutter to the liquid supply system.

In an embodiment, the liquid supply system comprises an outlet configured to remove liquid from the space and a gas inlet configured to provide flushing gas in said space. Flushing might be required every now and again due to contamination of the liquid or perhaps during a long term shut down of the apparatus. In this way, liquid may be removed from the space and the space can be flushed with gas. The shutter is then attached to the aperture to protect the projection system.

In an embodiment, the liquid supply system is configured to provide said liquid to a space between a final lens of said projection system and said substrate.

According to an aspect, there is provided a device manufacturing method comprising:

providing an immersion liquid to a space between a projection system and a substrate;

projecting a patterned beam of radiation, through said liquid, onto a target portion of the substrate using the projection system; and maintaining said projection system in contact with liquid after said substrate has been moved away from under said projection system.

Although specific reference may be made in this text to the use of the apparatus described herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
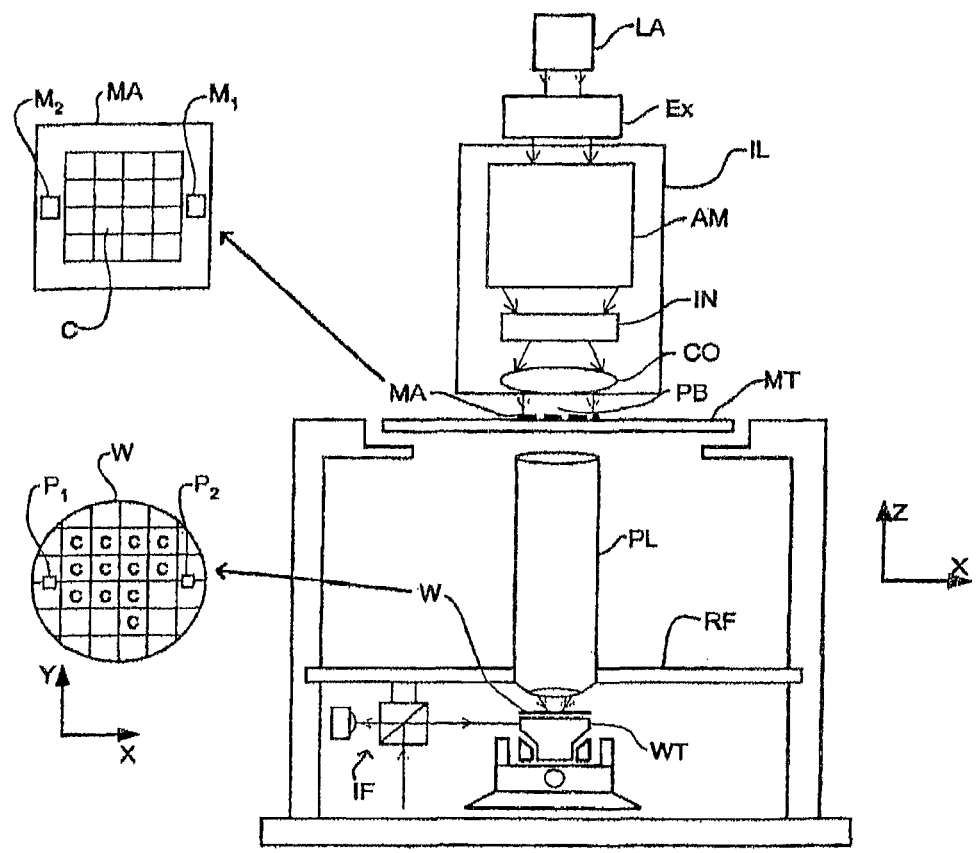
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. UV radiation), which in this particular case also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive lens system) for imaging an irradiated portion of the mask MA onto a target portion C (e.g. comprising one or more dies) of the substrate W.

As here depicted, the apparatus is of a transmissive (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
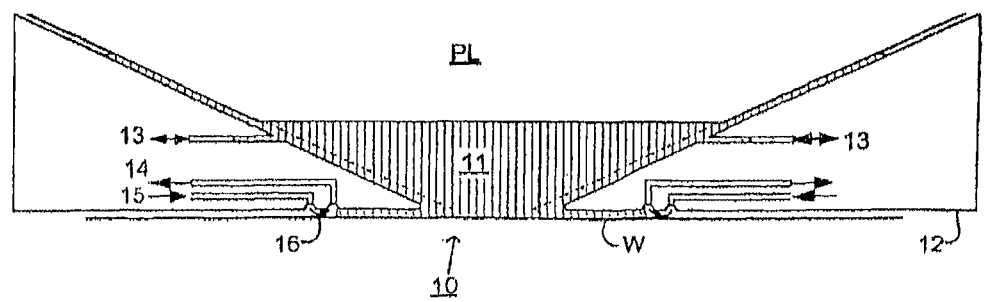
FIG. 2 depicts the liquid reservoir of a first embodiment of the invention.

FIG. 2 shows a liquid reservoir 10 between the projection system PL and the substrate W which is positioned on the substrate stage WT. The liquid reservoir 10 is filled with a liquid 11 having a relatively high refractive index, e.g. water, provided via inlet/outlet ducts 13. The liquid has the effect that the radiation of the projection beam is a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of focus.

The reservoir 10 forms, in an embodiment, a contactless seal to the substrate W around the image field of the projection lens PL so that the liquid is confined to fill the space between the substrate's primary surface, which faces the projection system PL, and the final optical element of the projection system PL. The reservoir is formed by a seal member 12 positioned below and surrounding the final element of the projection lens PL. Thus, the liquid supply system provides liquid on only a localized area of the substrate. The seal member 12 forms part of the liquid supply system for filling the space between the final element of the projection system and the substrate W with a liquid. This liquid is brought into the space below the projection lens and within the seal member 12. The seal member 12 extends a little above the bottom element of the projection lens and the liquid rises above the final element so that a buffer of liquid is provided. The seal member 12 has an inner periphery that at the upper end closely conforms to the shape of the projection system or the final elements thereof and may, e.g. be round. At the bottom the inner periphery forms an aperture which closely conforms to the shape of the image field, e.g. rectangular, though this is not necessarily so. The projection beam passes through this aperture.

The liquid 11 is confined in the reservoir 10 by a seal 16. As illustrated in FIG. 2, the seal is a contactless seal, i.e. a gas seal. The gas seal is formed by gas, e.g, air or synthetic air, provided under pressure via inlet 15 to the gap between seal member 12 and substrate W and extracted by first outlet 14. The over pressure on the gas inlet 15, vacuum level on the first outlet 14 and the geometry of the gap are arranged so that there is a high-velocity gas flow inwards towards the optical axis of the apparatus that confines the liquid 11. As with any seal, some liquid is likely to escape, for example up the first outlet 14.

Figure 9:
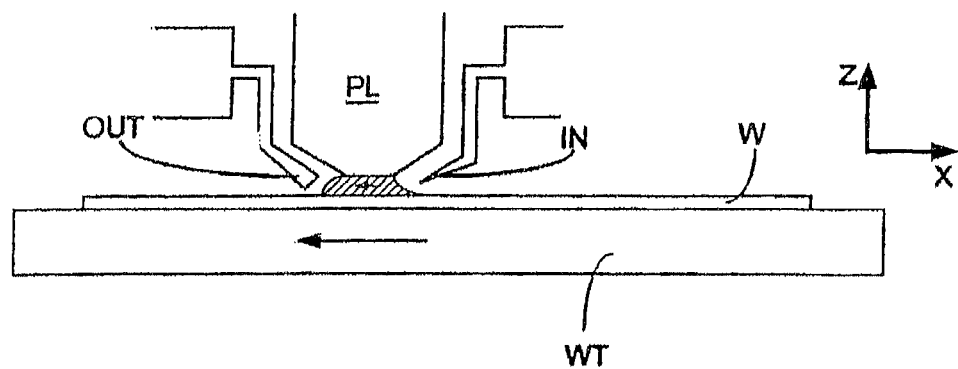
FIG. 9 illustrates an alternative liquid supply system according to an embodiment of the invention.
Figure 10:
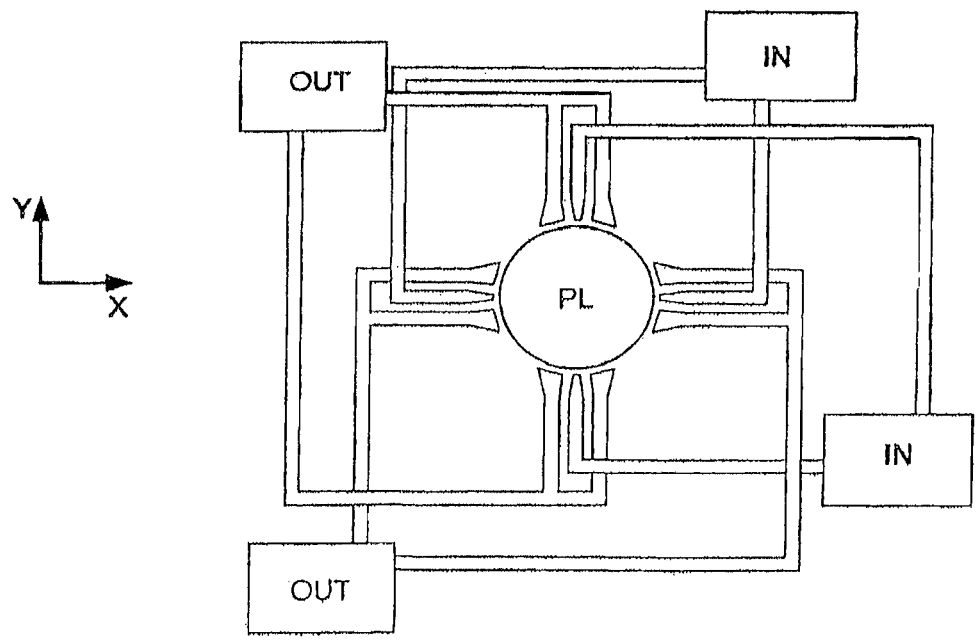
FIG. 10 illustrates, in plan, the system of FIG. 9.

FIGS. 9 and 10 also depict a liquid reservoir defined by inlet(s) IN, outlet(s) OUT, the substrate W and the final element of projection lens PL. Like the liquid supply system of FIG. 2 the liquid supply system illustrated in FIGS. 9 and 10, comprising inlet(s) IN and outlet(s) OUT, supplies liquid to a space between the final element of the projection system and a localized area of the primary surface of the substrate.

As can be seen from FIGS. 2 and 9, during exposure, the substrate W provides the bottom wall of the liquid reservoir thereby containing the liquid in a space between the projection system PL and the substrate W.

Figure 3:
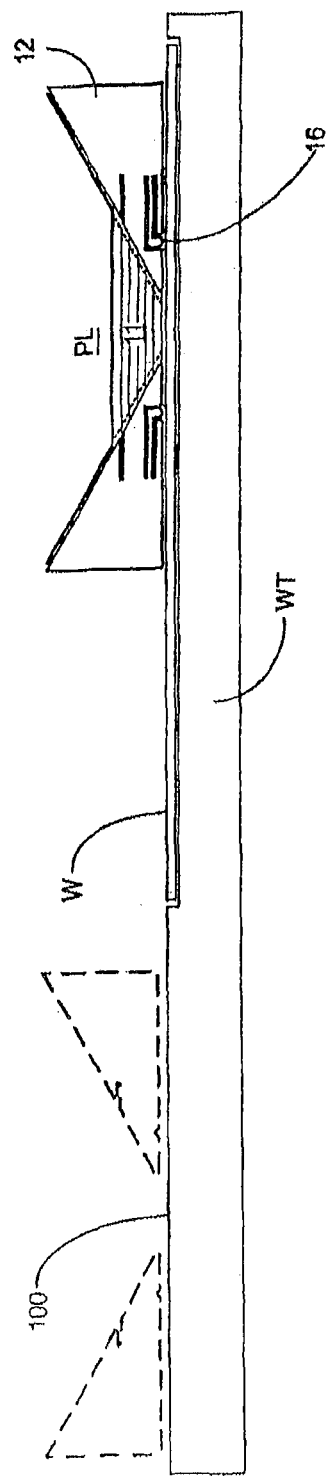
FIG. 3 depicts the liquid reservoir and substrate table of the first embodiment of the invention.

FIG. 3 shows the substrate table WT according to a first embodiment which can be used to avoid the necessity of emptying liquid from the liquid reservoir once the substrate W has been imaged and before being unloaded from the substrate table WT. A shutter member 100 (also termed a cover plate, edge seal member, gap seal means or member or intermediary plate) is provided for this purpose. The shutter member 100 is a surface other than a substrate surface, in this case an upper (as illustrated) primary surface of the substrate table WT which is substantially co-planar with the upper primary surface of the substrate W and is closely adjacent to the edge of the substrate W. The area of the shutter member 100 is large enough so that if the substrate table WT is moved such that the projection system PL and seal member 12 are positioned over the shutter member 100 (as illustrated in dotted lines) the shutter member blocks the entire aperture of the seal member 12 to prevent liquid escaping through the aperture. In this position, the substrate W can be removed from the substrate table WT using usual substrate handling equipment. If the edge of the substrate W is close to the edge of the shutter member 100 (i.e. the gap between the substrate W, when positioned on the pimple table or chuck or whatever holds the substrate W to the substrate table WT, and the edge of the shutter member 100 is relatively small), there will be no sudden loss of liquid as the edge of the substrate moves under the aperture in the seal member 12. The substrate table WT may be raised towards the projection system to block the aperture so that the seal 16 can be deactivated.

Embodiment 2

Figure 4:
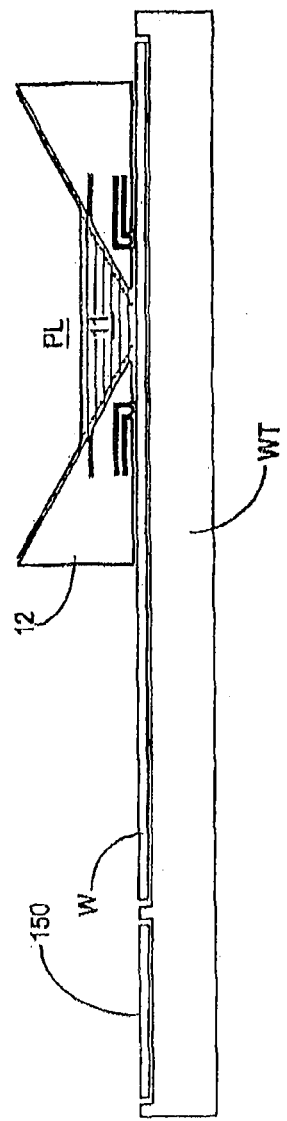
FIG. 4 depicts the liquid reservoir, substrate table and shutter member of a second embodiment of the invention.

A second embodiment is illustrated in FIG. 4 and allows the substrate table WT to be moved completely away from the projection system PL and seal member 12 in order for the substrate W to be removed from the substrate table WT and a new substrate to be placed on the substrate table WT. Thus it can be used, for example, with dual stage machines.

In the second embodiment, a shutter member 150 is in the form of a plate with a primary cross-sectional area larger than that of the localized area or aperture in the seal member 12. The shape of the shutter member 150 may be any shape so long as it covers the aperture. The shutter member 150 is not a substrate and is movable relative to both the substrate table WT and the seal member 12 and may be attached to the seal member 12 by any means, two examples of which are described below, After imaging of the substrate W, the substrate table WT is moved so that the shutter member 150 is positioned under the aperture of the seal member 12. The gap between the substrate W and the top surface of the substrate table WT and the gap between the top of the substrate table WT and the top surface of the shutter member 150 are small so there is no catastrophic loss of liquid from the reservoir 10 while passing over the gaps. The top (primary) surfaces (as illustrated) of the substrate W, substrate table WT between the substrate W and the shutter member 150 and the shutter member 150 are arranged to be substantially co-planar. Once positioned under the projection system PL, the shutter member 150 is attached to the bottom of the seal member 12 to cover the aperture. The seal member 12 is then moved away from the substrate table WT in the Z direction (the direction of the optical axis) or the substrate table WT is lowered away from the seal member 12. The substrate table WT may then be moved out of the way to a place where the substrate W may be exchanged. Once a new substrate has been loaded onto the substrate table WT and any necessary alignment or other measurements (e.g. leveling) have been made (e.g. in a dual stage machine), the substrate table WT is moved to a position where the shutter member 150 may be re-positioned onto the substrate table WT and then the substrate table WT is moved such that the substrate W is positioned under the projection system PL so that exposure can begin.

Of course it may be possible to provide the shutter member 150 on an object in the lithographic apparatus other than the substrate table WT. For example, a robotic arm can be provided which moves to position the shutter member under the projection system after exposure.

The position of the shutter member 150 may drift over time so that means for centering or at least keeping a track of the position of the shutter member is useful. This may be a mechanical or optical or electrical or other type of sensor on the landing area of the shutter member on the substrate table WT and/or such a sensor provided on the liquid supply system (e.g. seal member 12). For such a system, a quartz shutter member is desired, especially for an apparatus which exposes at 193 nm. Alternatively or additionally, a through lens sensor and detector that uses a reflected signal from a marker on the shutter member 150 which signal is coupled via a beam splitter to the detector is provided. Such a system can be used while the substrate stage WT is moving, thereby improving throughput. Alternatively or additionally, the position of the shutter member may be measured by an optical sensor on the substrate table WT. In this case a mark is applied to the underside or top side of the shutter member 150 (e.g. a transmissive pattern for the radiation wavelength) and the position of the shutter member 150 may then be measured by a sensor on the substrate table WT while the projection system PL exposes the mark. The mark is transmissive to radiation from the projection system (or another radiation source) and a transmission image sensor (TIS) or spot-sensor which is on the substrate table WT can then be used to measure displacement of the shutter member when attached to the liquid supply system. Depending on the mark design on the shutter member, the transmission image sensor (TIS) or spot sensor that is already available in the substrate table WT can be used. In this way, the apparatus can keep a record of the drift in position of the shutter member over time by sensing the position regularly, for example every cycle or perhaps only every ten or one hundred cycles or when is deemed necessary. Any necessary adjustments can then be made.

Alternatively, a quad cell sensor can be mounted at the center of the shutter member 150. An absorbing (or transmissive) spot is positioned in the center of the mirror block so that when the shutter member 150 is positioned on the substrate stage WT after use, its position can be measured. The quad cell sensor is made up of four light sensitive cells in a square. When the light beam is on center the outputs of the four cells are equal. If the sensor drifts to one side, the outputs of the cells on that side increase compared to the cells or the other side. Thus any deviation from the desired position can be corrected the next time the shutter member 150 is attached to the liquid supply system.

Another way of centering the shutter member 150, which does not involve complicated positional sensing, is to provide the shutter member 150 with a shape which is self centering when picked up by the liquid supply system. A suitable example might be a thicker shutter member 150 than is needed with a conical edge that locates in the aperture of the liquid supply system.

Figure 5:
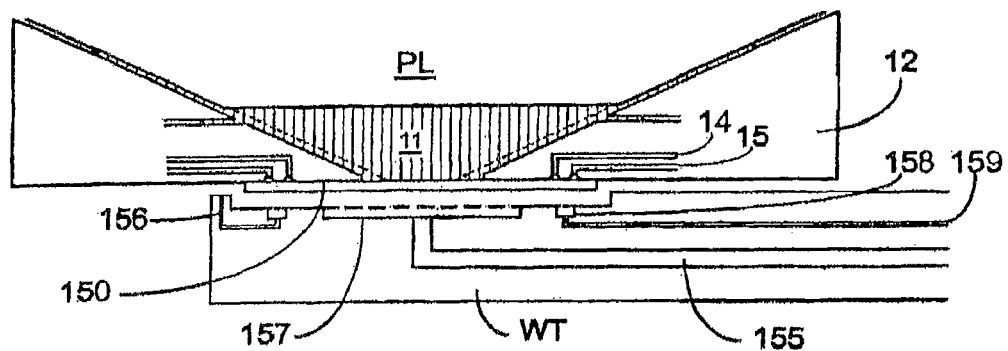
FIG. 5 depicts the liquid reservoir, substrate table and shutter member of the second embodiment of the present invention.

FIG. 5 illustrates one way of attaching the shutter member 150 to the underside of the seal member 12. This method usefully makes use of the seal 16 of the seal member 12. The outlet 14 is energized and the (gas) inlet 15 is not energized when the shutter member 150 is positioned under the aperture. The vacuum provided in the outlet 14 is enough to attract the shutter member 150 to be clamped to the bottom of the seal member 12 thereby sealing the aperture. When the shutter member 150 is replaced on the substrate table WT, the seal 16 can be reactivated to operate as normal and the substrate table WT moved to the expose position. The shutter member 150 may be held on the substrate table WT by use of vacuum outlet 157 connected to a vacuum source through a duct 155. To avoid or reduce immersion liquid leakage under the shutter member 150, a (annular) channel 158 is provided around the vacuum outlet 157. The channel 158 is connected via a duct 159 to a vacuum source so that any liquid is removed by the flow of gas through the channel 158 caused by the vacuum. It might be advantageous to have a flow of gas in the channel 158, even when the shutter member 150 is in place. To this end a duct 156 open at a surface, for example the top surface of the substrate table WT, and connected to the channel 158 can be provided on a side substantially opposite to the duct 159 leading to the vacuum source. In the second embodiment, the seal 16 need not be activated while the shutter member 150 is positioned to cover the aperture but, in an embodiment, is activated.

Figure 6:
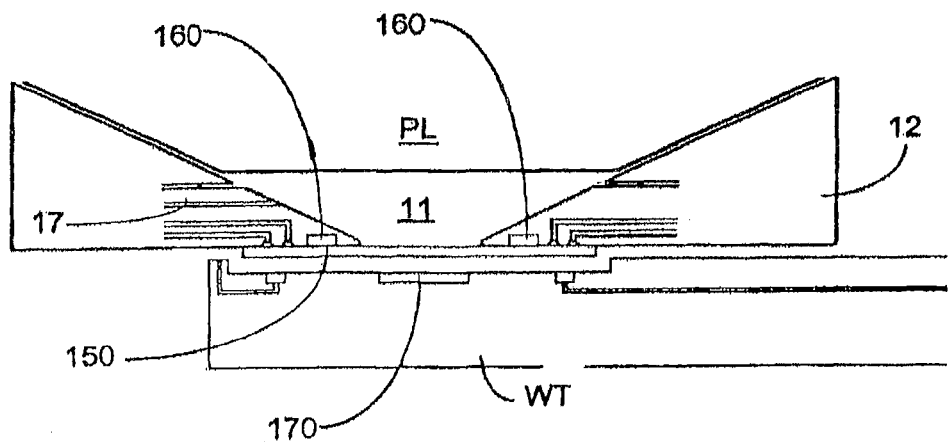
FIG. 6 illustrates an alternative arrangement of the second embodiment of liquid reservoir, substrate table and shutter member of the present invention.

An alternative means for holding the shutter member 150 to the substrate table WT and means for attaching the shutter member 150 to the seal member 12, is illustrated in FIG. 6. In this embodiment the shutter member 150 is made of a ferromagnetic material (or partly of ferromagnetic material by making an assay) such that magnets 160, 170 (in an embodiment, electromagnets for easy attachment and detachment) positioned on the seal member 12 and substrate table WT may be used to hold the shutter member 150 in position against the seal member 12 and substrate table WT respectively. By keeping seal 16 activated, loss of liquid can be minimized. The channel 158 and duct 156, 159 arrangement described in relation to the FIG. 5 embodiment may also be employed in the FIG. 6 embodiment to reduce or alleviate liquid leakage under the shutter member 150.

The shutter member 150 should be held by at least one of the substrate table WT and the seal member 12 so that the shutter member 150 is under control.

As it is further illustrated in FIG. 6, it may be desirable to remove liquid 11 from the reservoir 10 during substrate exchange. This is done by extracting the liquid either through the outlet 14 or the outlet duct 13 (see, e.g., FIGS. 5 and 2 respectively) and then flushing the space with gas provided through a further gas inlet 17. This might be done for maintenance and the lens may need to be cleaned after this process.

Of course, features from both FIGS. 5 and 6 can be combined.

Embodiment 3

Figure 7:
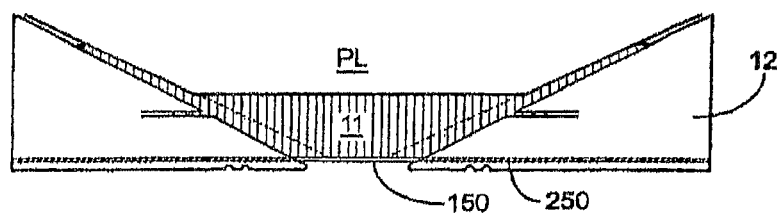
FIG. 7 illustrates a third embodiment of the present invention.

A third embodiment is the same as the second embodiment except as described below. The third embodiment is illustrated in FIG. 7 and differs from the second embodiment in that the shutter member 150 is placed within the seal member 12. The similarity with the second embodiment lies in the fact that the shutter member is separate from the substrate table WT. The shutter member 150 can be moved from any resting position to block the aperture by being moved under the projection system PL through channels 250 in the seal member 12.

Figure 8:
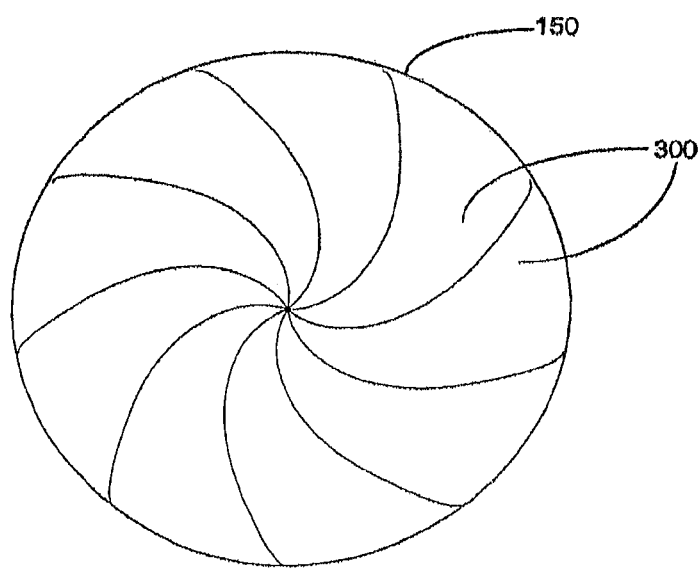
FIG. 8 illustrates a variant of the third embodiment.

The shutter member 150 may either be separate from the seal member 12 and moved into the seal member 12 at the required time by a robotic arm, for example, or the shutter member may have a series of leafs 300 as illustrated in FIG. 8. The leafs 300 work like a shutter of a camera in that the leafs can be moved such that they do not obstruct the aperture but, when the plurality of leafs are moved to abut at the center of the aperture they thereby block the aperture.

Embodiment 4

Figure 11:
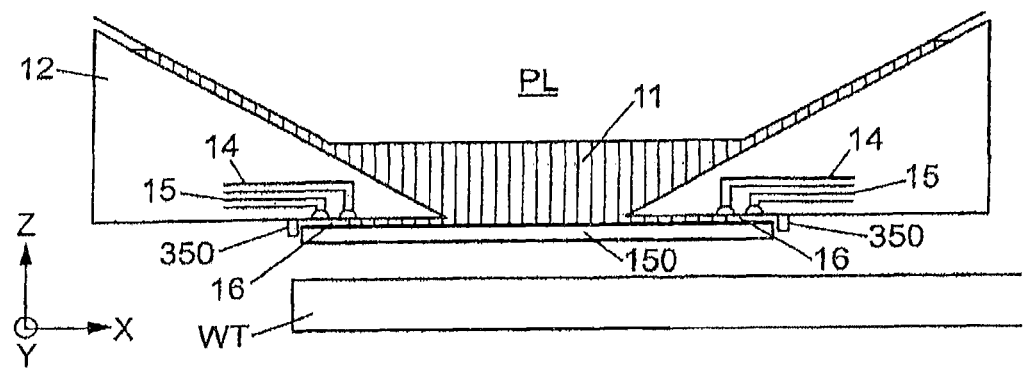
FIG. 11 depicts the liquid reservoir, substrate table and shutter member of a fourth embodiment of the present invention.
Figure 12:
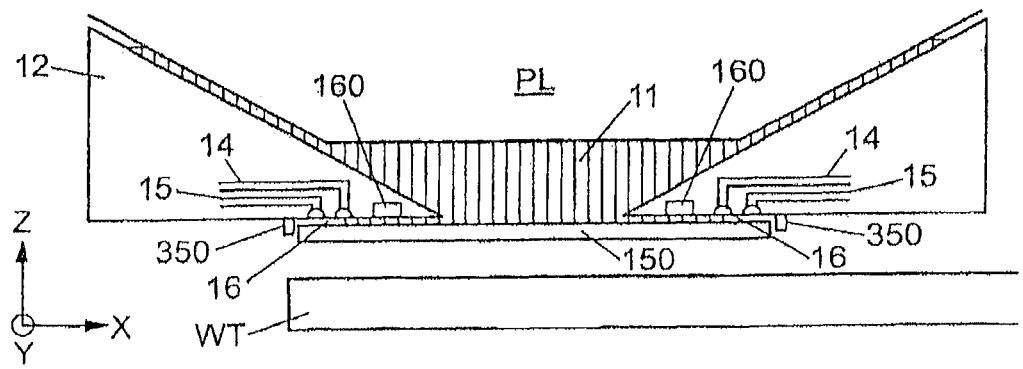
FIG. 12 illustrates an alternative arrangement of the fourth embodiment of liquid reservoir, substrate table and shutter member of the present invention.

A fourth embodiment is the same or similar as the second embodiment except as described below. The fourth embodiment is illustrated in FIGS. 11 and 12. In this embodiment, the shutter member 150 is in the form of a plate but the shutter member 150 does not come into contact with the bottom surface of the seal member 12. An advantage of not having the shutter member 150 come into contact with the seal member 12 is that it eliminates or at least reduces the chances of contaminating particles being generated from contact of the shutter member 150 with the seal member 12. Once positioned under the projection system PL, the shutter member 150 is connected to the bottom of the seal member 12, as, for example, implemented below, to cover the aperture in the seal member 12.

In an implementation, as shown in FIG. 11, the shutter member 150 is connected to the underside of the seal member 12 using the seal 16 of the seal member 12. Both the outlet 14 and the (gas) inlet 15 remain energized when the shutter member 150 is positioned under the aperture. However, the gas flow is adjusted so that there is enough vacuum provided in the outlet 14 to attract the shutter member 150 toward the bottom of the seal member 12 but enough gas flow provided to inlet 15 to maintain a gap between the bottom of the seal member 12 and the shutter member 150. The gas flow in the seal 16 also can be sufficient to confine the liquid 11 in the liquid reservoir 10 while the shutter member 150 is connected to the seal member 12. When the shutter member 150 is replaced on the substrate table WT or other location, the gas flow in the seal 16 can be re-adjusted to operate as normal so as to release the shutter member 150.

In another implementation, as shown in FIG. 12, the shutter member 150 may be made of a ferromagnetic material (or partly of ferromagnetic material) such that magnets 160 (in an embodiment, electromagnets for easy connection and de-connection) positioned on the seal member 12 may be used to connect the shutter member 150 to the seal member 12. In an example, the attraction between the magnets 160 and the shutter member 150 is configured so as to maintain a gap between the bottom of the seal member 12 and the shutter member 150. Alternatively or in addition, the gas flow of seal 16 may be adjusted so as to maintain the gap between the bottom of the seal member 12 and the shutter member 150. Where liquid 11 is present in the liquid reservoir 10, the gas flow in the seal 16 also can be sufficient to confine the liquid 11 in the liquid reservoir 10 while the shutter member 150 is connected to the seal member 12.

Referring to FIGS. 11 and 12, one or more projections 350 may be provided on the seal member 12 to restrict the position of the shutter member 150 in the X-Y plane. In a typical arrangement, a plurality of projections 350 are provided on the bottom surface of the seal member 12 and are located such that they would be outward of the periphery of the shutter member 150 when the shutter member 150 is connected to the seal member 12. The projection 350 may also be in the form a ring or other peripheral arrangement that is outward of the periphery of the shutter member 150 when the shutter member 150 is connected to the seal member 12. In an embodiment, three projections 350 are provided in a triangular layout to determine the shutter member 150 in the X-Y plane. In an embodiment, the projection(s) 350 is retractable so as to eliminate or at least reduce the chance that the projection(s) 350 deleteriously contacts the substrate table WT, the substrate or any other part of the lithographic apparatus.

Embodiment 5

Figure 13:
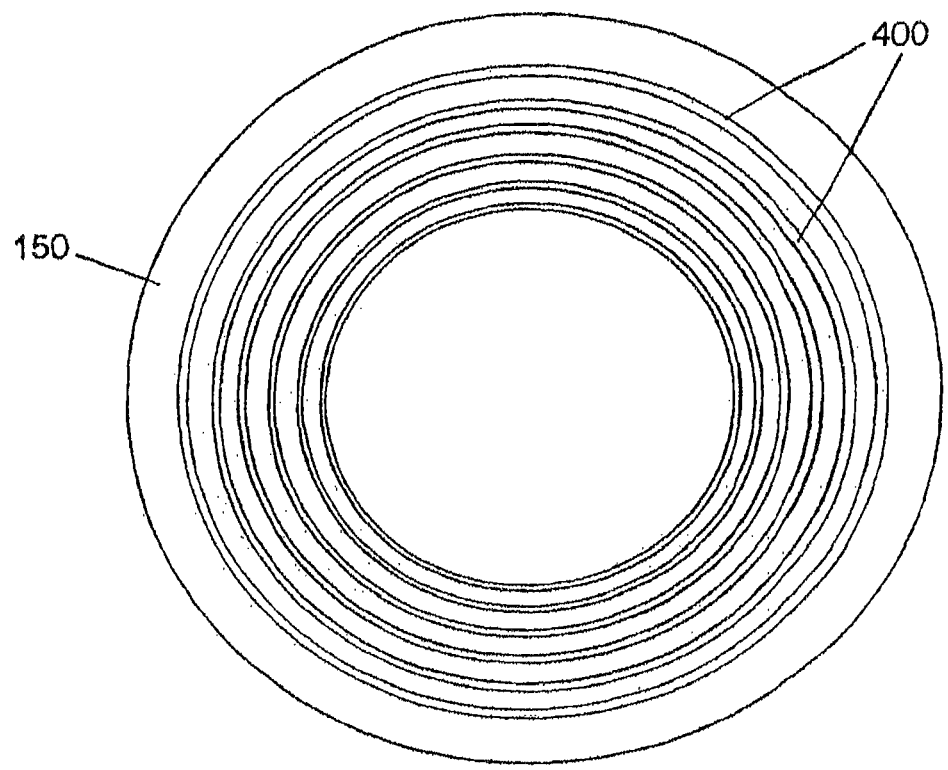
FIG. 13 illustrates a top view of a shutter member according to a fifth embodiment of the present invention.
Figure 14:
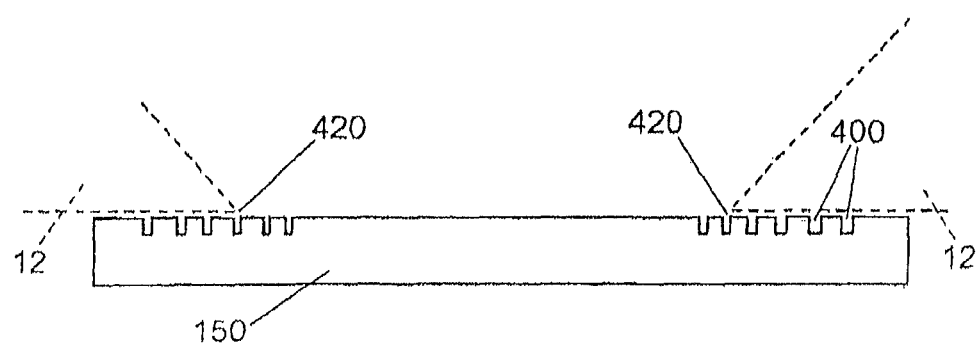
FIG. 14 illustrates a side view of a shutter member according to a fifth embodiment of the present invention.
Figure 15:
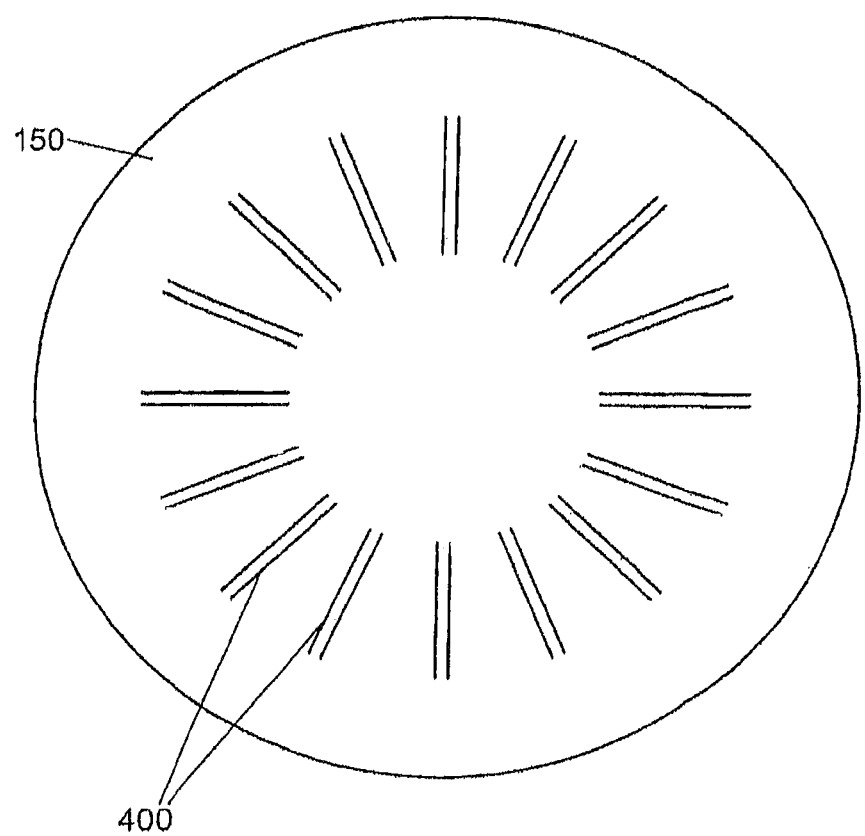
FIG. 15 illustrates a top view of a shutter member according to a fifth embodiment of the present invention.

FIGS. 13, 14 and 15 depict an embodiment of the shutter member 150 of, for example, any or all of the foregoing embodiments. In FIG. 14, the position of the seal member 12 is generally shown by dashed lines.

In some situations, the liquid 11 in the liquid reservoir 10 may comprise contaminating particles, such particles coming into the liquid, for example, through the physical contact of the seal member 12 and the shutter member 150. So, in a situation where the shutter member 150 is attached to or connected to the seal member 12 and the seal 16 is maintained in whole (both gas supply and gas removal of the seal 16 are activated) or in part (only gas removal of the seal 16 is activated), particles may be attracted to, and possibly trapped in, the inner interface 420 between the seal member 12 and the shutter member 150 due to liquid flow outwards caused by the gas removal of the seal 16 between the shutter member 150 and the seal member 12.

So, in this embodiment, the shutter member 150 is provided with one or more channels 400, the channels 400 being provided at least on the shutter member 150 at the location on the shutter member 150 of the inner interface 420 between the seal member 12 and the shutter member 150. Through the use of channels, the contact area at the inner interface 420 of the seal member 12 and the shutter member 150 can be reduced and thus, for example, reducing the chances of particles being created through contact between the shutter member 150 and the seal member 12. Further, liquid flow through the channels when the shutter member 150 is connected to the seal member 12 can help to reduce trapping of particles that are smaller in diameter than the channel depth and/or width.

In an implementation, the channels 400 are 1 to 10 micrometers deep. Where the shutter member 150 is attached to or connected to the seal member 12 through the vacuum of the seal 16, the depth of the channels should be made such that enough vacuum remains to keep the shutter member 150 in place.

In FIG. 13, the shutter member 150 is a circular disk and the channels 400 are depicted as concentric circular channels provided only on the shutter member 150 in the general location on the shutter member 150 of the inner interface 420 between the seal member 12 and the shutter member 150. In other implementations, the shutter member 150 and/or the channels 400 may be in other shapes such as rectangular. Further, the channels 400 may be provided over the entirety of the shutter member 150.

In FIG. 14, the channels 400 are depicted having a rectangular profile. In an implementation, the channels 400 may have different profiles such as semi-circular. Furthermore, the number of channels 400 may vary although in an embodiment, the number of channels is high, at least at the inner interface 420, to promote greater flow and reduced contact area.

In FIG. 15, the shutter member 150 is a circular disk and the channels 400 are depicted as radial channels provided only on the shutter member 150 in the general location on the shutter member 150 of the inner interface 420 between the seal member 12 and the shutter member 150. In other implementations, the shutter member 150 may be in another shape such as rectangular. Further, the channels 400 may be provided over the entirety of the shutter member 150. Also, as with FIG. 14, the profile may have a rectangular or other different profile and the number of channels 400 may vary although in an embodiment, the number of channels is high, at least at the inner interface 420, to promote greater flow and reduced contact area. Where, for example, a seal 16 is employed, with radial channels, a small liquid flow of liquid 11 towards the seal 16 is provided. This liquid flow may rinse the shutter member 150 and prevent or reduce trapping of particles at interface 420 since these particles can be removed by the liquid or kept in the liquid.

In an embodiment, shutter member 150 contacts seal member 12 to position seal member 150 in a horizontal plane. Alternatively, the shutter member 150 may be displaced from seal member 12 as described above and some other means such as projections 350 may be used to keep shutter member 150 in place.

In an embodiment, the channels may include projections (e.g., pimples) to provide mechanical connection of the shutter member 150 to the seal member 12 and/or to prevent or reduce possible bending of the shutter member 150.

Embodiment 6

Figure 16:
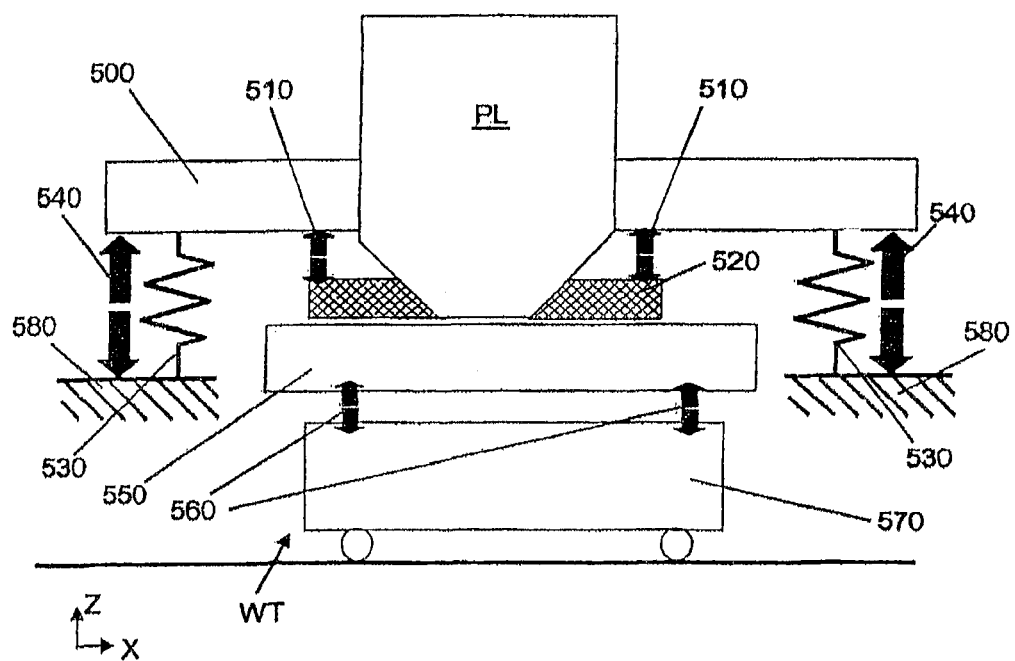
FIG. 16 illustrates a simplified layout of part of an immersion lithographic projection apparatus according to a sixth embodiment of the present invention.

Referring to FIG. 16, a simplified layout of part of an immersion lithographic projection apparatus is depicted according to an embodiment of the invention. In the layout, a projection system PL is connected to a projection system frame 500. The projection system frame 500 is supported on a base frame or ground 580 by a mount 530, 540, the mount comprising a spring 530 and a projection system frame actuator 540. In an embodiment, the mount may comprise a damper and one or more position sensors to provide position information used to control the projection system frame actuator 540. The projection system frame actuator 540 need not be part of the mount and could be separately provided and connected to the projection system frame 500. The projection system frame 500 is isolated from the base frame or ground 500 so that the projection system PL can be kept substantially free from vibrations.

A member 520 (such as the seal member 12 described herein) of the liquid supply system is connected to the projection system frame 500. In an embodiment, the member 520 is connected to the projection system frame 500 by a liquid supply member actuator 510, which can displace the member 520 in a direction substantially parallel to the Z direction (e.g., the direction of the optical axis of the projection system PL). Alternatively or additionally, the member 520 may be flexibly connected to the projection system frame 500 by a coupling (not shown). The part of the lithographic apparatus depicted in FIG. 15 further comprises a substrate table WT, which in this case comprises a substrate holder 550 supported by a substrate stage 570, the substrate holder 550 being connected and displaceable relative to the substrate stage 570 by a substrate holder actuator 560. The substrate holder 550 holds a substrate W (not shown). In an embodiment, the liquid supply member actuator 510 and/or the substrate holder actuator 560 may have one or more dampers associated therewith. Also, or alternatively, one or more position sensors may be provided to supply position information used to control the liquid supply member actuator 510 and/or the substrate holder actuator 560. For example, an interferometer may be provided to measure the position of the substrate table WT with respect to the projection system frame 500.

During exposure of the substrate W, the member 520 is supported on the substrate holder 550 (whether directly or indirectly via the substrate W) so that the weight of the member 520 is carried by the substrate holder 550 (and the substrate table WT generally) when no gravity compensation of the member 520 is provided. Before or after exposure of the substrate W, the member 520 is displaced relative to the substrate holder 550 (e.g., by the liquid supply member actuator 510 displacing the member 520 away from the substrate holder 550, by the substrate holder actuator 560 displacing the substrate holder 550 away from the member 520 or a combination of both) so that the substrate W can be removed from or provided to the substrate holder 550 as appropriate.

The transfer of the weight of the member 520 between the substrate holder 550 and the projection system frame 500 may deform the relatively weak springs 530 supporting at least part of the projection system frame 500. Due to a very low stiffness of the projection system frame 500, the weight transfer may introduce a relatively large displacement and temporarily instability of the system. Since the projection system frame actuator 540 typically has a low frequency, the projection system frame actuator 540 may not be able to compensate for the weight transfer in time resulting in a movement of the projection system frame 500. Such movement may cause measurement errors, exposure errors and/or failure, or any combination.

Accordingly, in an embodiment, the force for supporting the substrate holder 550 and the member 520 is measured or determined before the member 520 is displaced from the substrate holder 550. For example, the force of the substrate holder actuator 560 used to support the substrate holder 550 and the member 520 may be measured. Similarly, the force for supporting the member 520 is measured or determined before the member 520 is displaced to the substrate holder 550. For example, the force of the liquid supply member actuator 510 used to hold the member 520 may be measured.

When the member 520 is displaced relative to the substrate holder 550 so that the member 520 is no longer supported on the substrate holder 550, the force for keeping the substrate holder 550 in place (for example, the force of the substrate holder actuator 560) will decrease due to the reduction of weight. However, the force for supporting the projection system frame 500, e.g., the force of the projection system frame actuator 540 used to support the projection system frame 500, will increase by substantially the same amount as needed to support the member 520 on the substrate holder 550. So, to keep the projection system frame 500 in place, the force of the projection system frame actuator 540, for example, should increase to prevent or at least reduce the projection system frame 500 from lowering due to the weight of the member 520 it now carries.

Similarly, when the member 520 is displaced relative to the substrate holder 550 so that the member 520 is supported on the substrate holder 550, the force for holding the member 520 in place (for example, the force of the liquid supply member actuator 510) will decrease due to the reduction of weight. So, the force for supporting the projection system frame 500, e.g., the force of the projection system frame actuator 540 used to support the projection system frame 500, will also decrease by substantially the same amount as needed to hold the member 520 on projection system frame 500. So, to keep the projection system frame 500 in place, the force of the projection system frame actuator 540, for example, should decrease to prevent or at least reduce the projection system frame 500 from raising due to the weight of the member 520 it no longer carries.

The additional or reduced force needed, as appropriate, for the projection system frame actuator 540, as an example, may be determined from the change of force to support the substrate holder 550, e.g., the change of force in the substrate holder actuator 560, and/or the change of force to hold the member 520, e.g., the change of force in the liquid supply member actuator 510. The change of force can be measured, for example, by a force sensor. Alternatively or additionally, the change of force can be determined from errors and corrections generated in the control loops of any or all of the various actuators, e.g., the projection system frame actuator 540, the liquid supply system actuator 510 and/or the substrate holder actuator 560. The actuators then act essentially as a pair of scales to measure the weight of the part of the liquid supply system transferred between the projection system frame 500 and the substrate table WT.

Alternatively or additionally, the additional or reduced force needed, as appropriate, may be determined from information about the weight transfer between the projection system frame 500 and the substrate table WT, including, for example, a calculation based on the mass of the member 520, the mass of the substrate holder 550, the mass of the projection system frame 500 and/or other physical characteristics of the lithography apparatus.

In each circumstance, the change of force can be used in a feed-forward or feedback manner. For example, the additional or reduced force for the projection system frame actuator 540, derived, for example, from the change of force in the substrate holder actuator 560 or the liquid supply member actuator 510, can be fed forward to the projection system frame actuator 540 so as to prevent or at least reduce the raising or lowering, as appropriate, of the projection system frame 500. A feed-forward loop may prevent the projection system frame 500 from lowering or raising since the feed-forward signal may be of relatively high-frequency while the band-width of the projection system frame actuator 540 typically has a low frequency.

A controller (not shown) may be provided to obtain appropriate measurements and data (e.g., force measurements from a force sensor and/or data from actuator control loops) and to make the appropriate determinations (e.g., by calculation or table look-up) of a change of force attributable to the weight transfer and/or the corresponding force to be applied to the projection system frame 500 to compensate for the weight transfer. The controller may be electronic, mechanical, software based, or any combination thereof. In an embodiment, the controller is a software program of the lithographic apparatus.

In short, the transfer of the weight of a part of the liquid supply system between the projection system frame 500 and the substrate table WT can be determined and/or measured. A signal representative of the weight transfer can be fed forward (or fed back) into the control signal of the projection system frame mount 530,540 to prevent or at least reduce low frequency movements of the projection system frame 500 having large position overshoots. Advantageously, settling time for the system may be reduced and the stability of the projection system may be improved.

In an embodiment, there is provided a lithographic projection apparatus comprising: a substrate table by which a substrate is held; a projection system by which a patterned beam is projected onto a target portion of the substrate, liquid being provided to a space between the projection system and the substrate; and a member having a first side and a second side opposite from the first side, the member being removably positionable adjacent to the projection system between the projection system and the substrate table so that the first side faces the projection system and the second side faces the substrate table to isolate the space provided with the liquid which contacts the first side of the member from a second space located on the second side of the member, wherein the member is separable from the substrate table and the projection system.

In an embodiment, the member is positionable opposite the projection system such that liquid can be confined between the projection system and the member. In an embodiment, the member is releasably connectable to an object in the apparatus. In an embodiment, the apparatus further comprises a vacuum-clamp by which the member is releasably connectable to the object.

In an embodiment, there is provided a lithographic projection apparatus comprising: a support structure configured to hold a patterning device, the patterning device configured to pattern a beam of radiation according to a desired pattern; a substrate table configured to hold a substrate; a projection system configured to project the patterned beam onto a target portion of the substrate; a liquid supply system comprising a container at least partly defining a space between the projection system and the substrate, the container having a selectively openable and closeable aperture therein, the aperture having an area smaller than an area of the substrate, the patterned beam capable of being projected through liquid in the space and the aperture onto the substrate; and a closure configured to selectively close and open the aperture.

In an embodiment, the closure is positionable on a side of the liquid supply system opposite the projection system such that liquid can be confined in the liquid supply system and between the projection system and the closure. In an embodiment, the closure is releasably connectable to the liquid supply system. In an embodiment, the closure is separable from the remainder of the apparatus. In an embodiment, the closure is displaced from the liquid supply system when connected to the liquid supply system. In an embodiment, the apparatus comprises a magnet, a vacuum outlet, or both, configured to connect the closure to the liquid supply system. In an embodiment, the container comprises a gas inlet and a vacuum outlet configured to form a seal between the container and the closure. In an embodiment, the container comprises a projection extending from a surface of the container facing the closure and positioned outward of the closure. In an embodiment, the projection is retractable into the container. In an embodiment, the closure comprises a channel in a surface of the closure facing the aperture. In an embodiment, the channel is less than or equal to 10 micrometers deep. In an embodiment, the closure comprises a plurality of concentric channels provided at a location on the surface of the closure corresponding to a bound of the aperture. In an embodiment, the closure comprises a plurality of radial channels. In an embodiment, the liquid supply system comprises at least one inlet to supply liquid onto the substrate and at least one outlet to remove liquid after the liquid has passed under the projection system. In an embodiment, the liquid supply system is configured to provide the liquid to a space between a final lens of the projection system and the substrate.

In an embodiment, there is provided a device manufacturing method comprising: providing a liquid to a space between a projection system and a substrate, the space having a selectively openable and closeable aperture thereto, the aperture having an area smaller than an area of the substrate; projecting a patterned beam of radiation, through the liquid and the aperture, onto a target portion of the substrate using the projection system; and selectively opening and closing the aperture with a closure.

In an embodiment, the closure is separable from the remainder of a lithographic apparatus. In an embodiment, the method comprises releasably connecting the closure to a liquid supply system used to provide the liquid to the space. In an embodiment, the closure is displaced from the liquid supply system when connected to the liquid supply system. In an embodiment, the method comprises connecting the closure to the liquid supply system using a magnetic force, a vacuum, or both. In an embodiment, the method comprises forming a seal between a structure of the liquid supply system and the closure using a gas inlet and a vacuum outlet of the structure. In an embodiment, a structure of the liquid supply system comprises a projection extending from a surface of the structure facing the closure and positioned outward of the closure. In an embodiment, the method comprising retracting the projection into the structure. In an embodiment, the closure comprises a channel in a surface of the closure facing the aperture. In an embodiment, the channel is less than or equal to 10 micrometers deep. In an embodiment, the closure comprises a plurality of concentric channels provided at a location on the surface of the closure corresponding to a bound of the aperture. In an embodiment, the closure comprises a plurality of radial channels. In an embodiment, providing the liquid comprises supplying the liquid onto the substrate through at least one inlet and removing the liquid, after the liquid has passed under the projection system, through at least one outlet.

In an embodiment, there is provided a lithographic projection apparatus comprising: a support structure configured to hold a patterning device, the patterning device configured to pattern a beam of radiation according to a desired pattern; a substrate table configured to hold a substrate; a projection system configured to project the patterned beam onto a target portion of the substrate; a liquid supply system configured to provide liquid to a space between the projection system and the substrate; and a shutter configured to isolate the space from the substrate or a space to be occupied by a substrate.

In an embodiment, the shutter is positionable on a side of the liquid supply system opposite the projection system such that liquid can be confined in the liquid supply system and between the projection system and the shutter. In an embodiment, the shutter is releasably connectable to the liquid supply system. In an embodiment, the shutter is separable from the remainder of the apparatus. In an embodiment, the shutter is displaced from the liquid supply system when connected to the liquid supply system. In an embodiment, the apparatus comprises a magnet, a vacuum outlet, or both, configured to connect the shutter to the liquid supply system. In an embodiment, the liquid supply system comprises a gas inlet and a vacuum outlet configured to form a seal between the liquid supply system and the shutter. In an embodiment, the shutter comprises a channel in a surface of the shutter facing the projection system. In an embodiment, the channel is less than or equal to 10 micrometers deep. In an embodiment, the shutter comprises a plurality of concentric channels. In an embodiment, the shutter comprises a plurality of radial channels. In an embodiment, the liquid supply system comprises at least one inlet to supply the liquid onto the substrate and at least one outlet to remove the liquid after the liquid has passed under the projection system. In an embodiment, the liquid supply system is configured to provide the liquid to a space between a final lens of the projection system and the substrate.

The embodiments herein have been described in relation to the seal member variant of the localized area solution. However, the embodiments as described herein are equally applicable to any other type of liquid supply for example those disclosed in European Patent application nos. 03254078.3 or 03256643.2 hereby incorporated in their entirety by reference or to the variant illustrated in FIGS. 9 and 10. For example, in the case of a shutter member 150 moveable relative to both the substrate table WT and the projection system PL, means for attaching the shutter member below the in- and outlets IN, OUT may be attached to the members forming the in-and-out-lets IN, OUT, or to a separate structure. Additionally or alternatively, the vacuum of the outlets OUT can be used to attract the shutter member to the IN- and outlets IN, OUT and thereby seal the aperture. It may be desirable to use a non-flat shutter member e.g. one with a protruding border so that any drips of liquid from the various in- and out-lets are contained. Any system for generating a force can be used for the means for attaching, including low pressure sources, magnetic means, mechanical means, electro static means, etc.

While specific embodiments of the invention have been described above, it will be appreciated that the invention may be practiced otherwise than as described. The description is not intended to limit the invention.

The invention claimed is:

1. A lithographic projection apparatus comprising:
   a movable table;
   a projection system configured to project a patterned beam onto a target portion of a substrate;
   a container structure at least partly defining a space between the projection system and the table, the container structure comprising an aperture having a cross-sectional area smaller than a cross-sectional area of the substrate, wherein the patterned beam is capable of being projected through the aperture onto the substrate;
   an opening configured to supply liquid to the space; and
   a closure part of the container structure, the closure part movable relative to another part of the container structure to selectively close and open the aperture.

2. The apparatus of claim 1, wherein the closure part is positionable on a side of the container structure opposite the projection system such that liquid can be confined in the container structure and between the projection system and the closure part.

3. The apparatus of claim 1, wherein the closure part is releasable from the container structure.

4. The apparatus of claim 3, wherein the closure part is separable from the remainder of the apparatus.

5. The apparatus of claim 1, wherein the container structure comprises an outlet configured to remove liquid from the space, the outlet located in a lower surface of the container structure facing during exposure the table and/or substrate.

6. The apparatus of claim 1, wherein the container structure comprises a channel configured to have the closure part therein.

7. The apparatus of claim 1, wherein the closure part is within the container structure.

8. A device manufacturing method comprising:
   providing a liquid to a container structure at least partly defining a space between a projection system of a lithographic apparatus and a substrate, the container structure comprising an aperture having a cross-sectional area smaller than a cross-sectional area of the substrate;
   projecting a patterned beam of radiation, through the liquid and the aperture, onto a target portion of the substrate using the projection system; and
   selectively opening and closing the aperture by moving a closure part of the container structure with respect to another part of the container structure.

9. The method of claim 8, wherein the closure part is positionable on a side of the container structure opposite the projection system such that liquid can be confined in the container structure and between the projection system and the closure part.

10. The method of claim 8, further comprising releasing the closure part from the container structure.

11. The method of claim 10, wherein the closure part is separable from the remainder of the lithographic apparatus.

12. The method of claim 8, further comprising removing liquid from the space using an outlet of the container structure, the outlet located in a lower surface of the container structure facing during exposure the substrate.

13. The method of claim 8, further comprising moving the closure part within a channel of the container structure.

14. The method of claim 8, wherein the closure part is within the container structure.

15. A lithographic projection apparatus comprising:
   a movable table;
   a projection system configured to project a patterned beam onto a target portion of a substrate;
   a container structure at least partly defining a space between the projection system and the table, the container structure comprising an aperture having a cross-sectional area smaller than a cross-sectional area of the substrate, wherein the patterned beam is capable of being projected through the aperture onto the substrate;
   an opening formed in the container structure and configured to supply liquid to the space; and
   a closure movable within or on the container structure to selectively close and open the aperture.

16. The apparatus of claim 15, wherein the closure comprises a plate.

17. The apparatus of claim 15, wherein the container structure comprises an outlet configured to remove liquid from the space, the outlet located in a lower surface of the container structure facing during exposure the table and/or substrate.

18. The apparatus of claim 15, wherein the container structure comprises a channel configured to have the closure move therein.

19. The apparatus of claim 15, wherein the closure part is positionable on a side of the container structure opposite the projection system such that liquid can be confined in the container structure and between the projection system and the closure.

20. The apparatus of claim 15, wherein the opening is part of the container structure and located above the aperture.

* * * * *